(12) United States Patent
Spandre

(10) Patent No.: US 7,247,573 B2
(45) Date of Patent: Jul. 24, 2007

(54) PROCESS FOR FORMING TAPERED TRENCHES IN A DIELECTRIC MATERIAL

(75) Inventor: Alessandro Spandre, Pavia (IT)

(73) Assignees: STMicroelectronics S.r.l., Agrate Brianza (IT); OVONYX, Inc., Boise, ID (US)

( * ) Notice: Subject to any disclaimer, the term of this patent is extended or adjusted under 35 U.S.C. 154(b) by 37 days.

(21) Appl. No.: 11/018,213

(22) Filed: Dec. 20, 2004

(65) Prior Publication Data
US 2005/0142863 A1 Jun. 30, 2005

(30) Foreign Application Priority Data
Dec. 29, 2003 (EP) ................... 03425827

(51) Int. Cl.
H01L 21/302 (2006.01)
(52) U.S. Cl. .............. 438/714; 438/700; 438/713; 438/706
(58) Field of Classification Search ............. 438/706, 438/710, 714, 720, 700, 713; 216/58, 67
See application file for complete search history.

(56) References Cited

U.S. PATENT DOCUMENTS

| 4,582,581 | A |  | 4/1986 | Flanigan et al. ........ 204/192 E |
|---|---|---|---|---|
| 5,880,005 | A |  | 3/1999 | Tsai et al. .................. 438/424 |
| 6,043,163 | A | * | 3/2000 | Tsai et al. .................. 438/706 |
| 6,248,252 | B1 | * | 6/2001 | Nguyen et al. .............. 216/77 |
| 6,537,918 | B2 | * | 3/2003 | Ionov et al. ................ 438/710 |
| 6,635,185 | B2 | * | 10/2003 | Demmin et al. ............. 216/64 |
| 6,867,425 | B2 | * | 3/2005 | Wicker ......................... 257/3 |
| 2003/0003725 | A1 |  | 1/2003 | Uesawa ....................... 438/669 |
| 2003/0231530 | A1 |  | 12/2003 | Bez et al. ................... 365/200 |
| 2005/0009264 | A1 | * | 1/2005 | Ryu ............................ 438/221 |

FOREIGN PATENT DOCUMENTS

EP 0 050 972 A2 5/1985

OTHER PUBLICATIONS

Kim, S-B., et al., "Etching Mechanism of (Ba, Sr) TiO3 Films in High Density Cl2/BCl3/Ar Plasma," *Journal of Vacuum Science and Technology, Part A* 18(4):1381-1384, Jul./Aug. 2000.

* cited by examiner

Primary Examiner—Lan Vinh
(74) Attorney, Agent, or Firm—Lisa K. Jorgenson; Hai Han; Seed IP Law Group PLLC

(57) ABSTRACT

A process for forming a tapered trench in a dielectric material includes the steps of forming a dielectric layer on a semiconductor wafer, and plasma etching the dielectric layer; during the plasma etch, the dielectric layer is chemically and physically etched simultaneously.

23 Claims, 4 Drawing Sheets

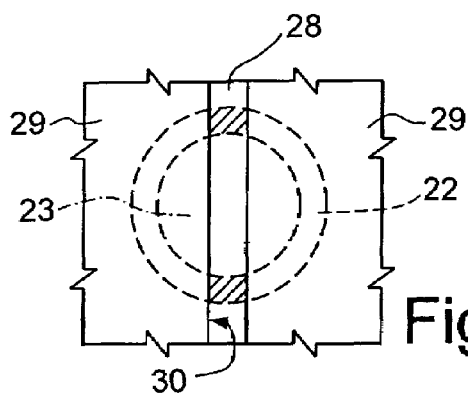
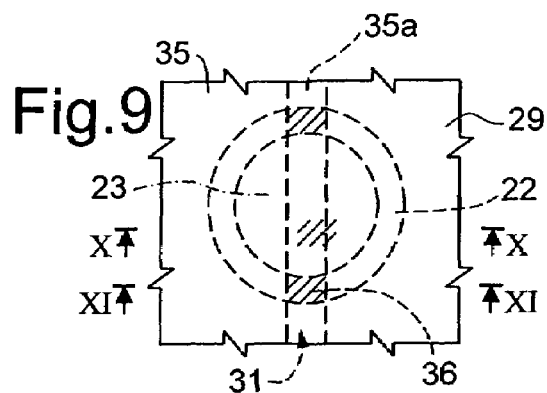
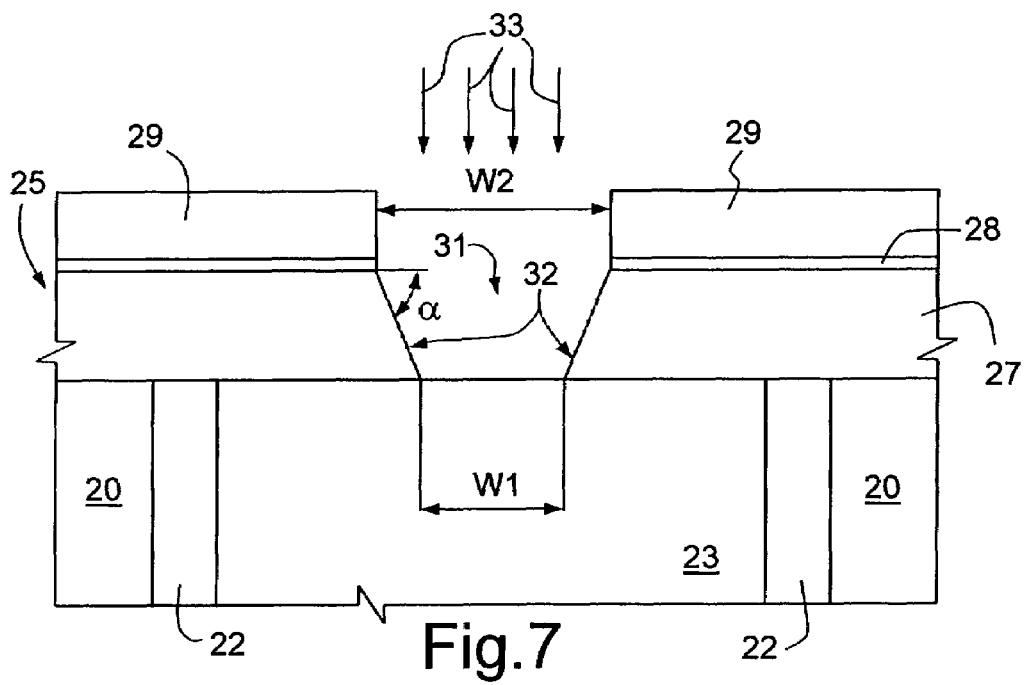
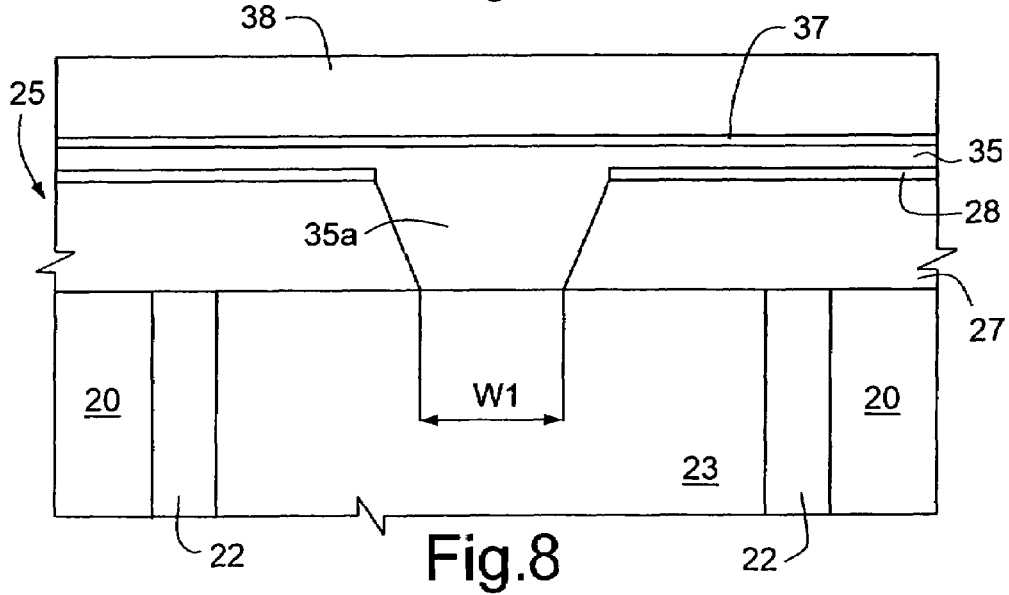

PROCESS FOR FORMING TAPERED TRENCHES IN A DIELECTRIC MATERIAL

BACKGROUND OF THE INVENTION

1. Field of the Invention

The present invention relates to a process for forming tapered trenches in a dielectric material, in particular microtrenches for phase change memory cells having sublithographic dimensions.

2. Description of the Related Art

As is known, processes for manufacturing integrated circuits and devices often require etching trenches having predetermined profiles, either in semiconductor or dielectric materials. In particular, trenches with tapered walls are in many cases preferred to vertical trenches, since at least two advantages are provided. On the one hand, in fact, electrical field lines are less dense around tapered trenches than around vertical trenches, and, on the other hand, even very narrow tapered trenches are likely to be homogeneously filled, whereas gaps or air bubbles may remain inside vertical trenches.

Normally, a polymerizing plasma etching process is used to open trenches with tapered walls; such a process is particularly effective in etching dielectric materials, e.g., silicon nitride or silicon oxide. A mixture comprising an etchant gas and a polymerizing agent is supplied to the surface of a wafer, which is partially protected by a photoresist mask. Suitable etchant gases are generally based on fluorine compounds, such as $CHF_3$, $CH_2F_2$, $CF_4$ or $SF_6$. A tapered profile is obtained because a polymeric passivating layer is deposited on sidewalls of the trenches while the etching is carried out. At the beginning, the whole wafer surface not protected by the mask and exposed to the plasma may be etched. As polymerization starts and the thickness of the polymer layer increases, the exposed area to be etched on the bottom of the trench is reduced. In practice, polymerizing plasma etch is based on a balance between the chemical etching of the exposed surfaces and the sidewall polymer deposition rate. When the polymer deposition rate prevails, a decreasing exposed surface is etched, so that the bottom width of the trench is reduced as its depth increases. Accordingly, the sidewalls are inclined (i.e., not vertical) and the trench has tapered profile.

However, known polymerizing plasma etching processes have some drawbacks. In the first place, of course, a polymerizing mixture is to be provided, further to an etchant agent, and a dedicated process step is required to remove the polymer passivation layer and to clean up the sidewalls of the trenches. Second, and more important, the balance between chemical etching and polymerization rate cannot be precisely controlled and errors may lead to useless trench profiles, especially in very thin layers having thickness of around 100 nm. For example, fluorine based chemical etching is very fast and tend to be isotropic against silicon nitride. As a consequence, when the process is unbalanced toward the side of chemical etching, U-shaped trenches are opened. On the contrary, etching process may be self-stopped, if the polymer deposition rate is too high, in this case, in fact, the polymer tends to deposit on the bottom of the trench as well, and prevents further etching.

Therefore, fluorine based polymerizing plasma etch is not suitable for making structures which require extremely accurate dimensional control, such as phase change memory (PCM) cells having a sublithographic dimension (i.e., a dimension that is lower than a minimum dimension obtainable through optical UV lithography).

As is known, phase change memory elements exploit the characteristics of materials which have the property of changing between two phases having distinct electrical characteristics. For example, these materials may change from an amorphous phase, which is disorderly, to a crystalline or polycrystalline phase, which is orderly, and the two phases are associated to considerably different resistivity.

At present, alloys of elements of group VI of the periodic table, such as Te or Se, referred to as chalcogenides or chalcogenic materials, can advantageously be used in phase change cells. The most promising chalcogenide alloy is formed by a combination of Ge, Sb and Te ($Ge_2Sb_2Te_5$), which is currently widely used for storing information in overwritable disks. In chalcogenides, the resistivity varies by two or more magnitude orders when the material passes from the amorphous phase (more resistive) to the polycrystalline phase (more conductive) and vice versa.

In particular, in phase change memories, a thin film of chalcogenic material is employed as a programmable resistor, which can be electrically heated by a controlled current so as to be switched between a high and a low resistance condition. The state of the chalcogenic material may be read applying a sufficiently small voltage so as not to cause a sensible heating and measuring the current passing through it. Since the current is proportional to the conductance of the chalcogenic material, it is possible to discriminate between the two states.

PCM cells may be made by etching microtrenches through a silicon nitride layer of around 60-90 nm, by filling the microtrenches with the film of phase change material and by removing the film outside the microtrenches; the microtrenches preferably have bottom width of less than 100 nm. In this case, tapered profile is highly recommended, to favor filling, and the bottom width is critical because a suitable current has to flow through the microtrench base. It is clear that polymerizing plasma etch cannot ensure sufficient control of the microtrench profile and dimensions.

BRIEF SUMMARY OF THE INVENTION

One embodiment of the present invention provides a process for forming tapered trenches in a dielectric material, which is free from the above-described drawbacks. In particular, the process comprises plasma etching a dielectric layer formed on a semiconductor wafer, wherein the step of plasma etching includes chemically etching and physically etching the dielectric layer simultaneously.

BRIEF DESCRIPTION OF THE SEVERAL VIEWS OF THE DRAWING(S)

For a better understanding of the present invention, a preferred embodiment thereof is now described, purely by way of non-limiting example, with reference to the attached drawings, in which:

FIG. 6 is a top plan view of the detail of FIG. 5;

FIGS. 7 and 8 are cross-sections of the detail of FIG. 5 in subsequent manufacturing steps;

FIG. 9 is a top plan view of the detail of FIG. 8, in a subsequent manufacturing step;

DETAILED DESCRIPTION OF THE INVENTION

Hereinafter, reference will be made to the field of phase change memories; however, it is understood that the invention may be exploited in any other case in which etching trenches with tapered profile is required.

Figure 1:
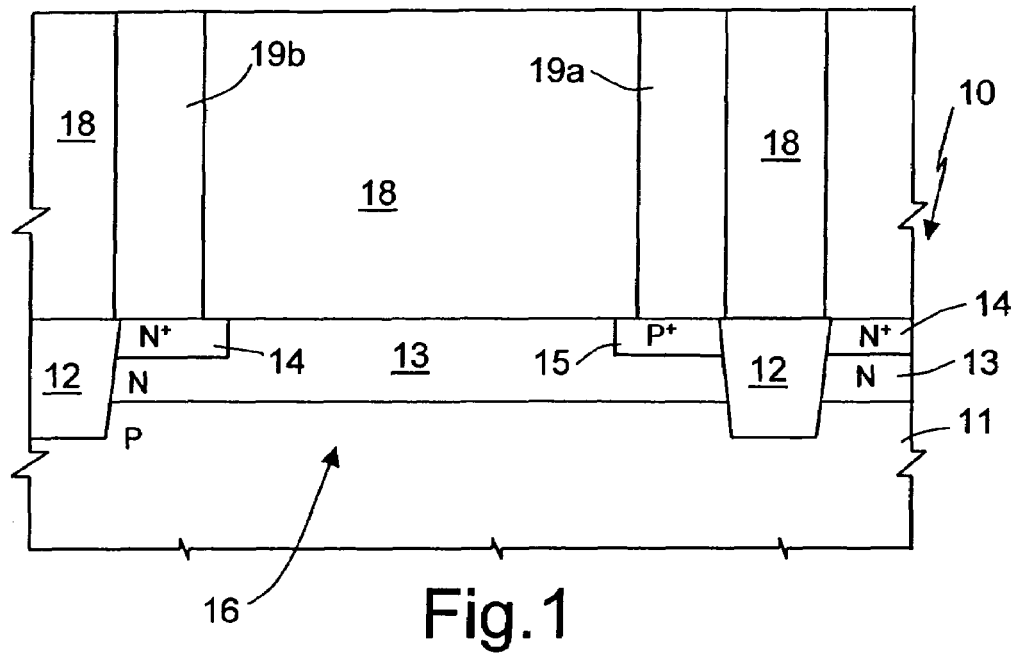
FIG. 1 is a cross-section through a semiconductor wafer, taken along line I-I of FIG. 2, at an initial step of a manufacturing process according to the present invention.
Figure 3:
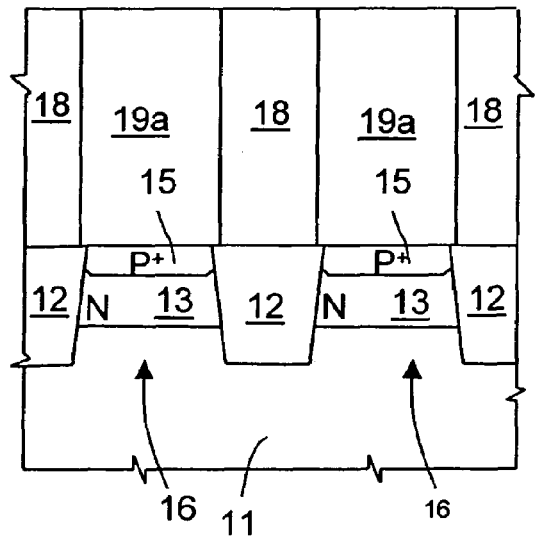
FIG. 3 is a cross-section of the wafer of FIG. 1, taken along line III-III of FIG. 2.

With reference to FIGS. 1 and 3, initially a wafer 10 comprising a substrate 11 of P-type is subjected to standard front end manufacturing steps. In particular, inside the substrate 11 insulation regions 12 are formed and delimit active areas 16; then base regions 13 of N-type are implanted.

Next, a first dielectric layer 18 is deposited and planarized; openings are formed in the first dielectric layer 18 above the base regions 13 and emitter regions 15. At this point, using two dedicated masks and exploiting the self-alignment in the openings, base contact regions 14 of $N^+$-type and emitter regions 15 of $P^+$-type are implanted. Then the openings in the first dielectric layer 18 are covered by a barrier layer, for example a Ti/TiN layer, before being filled with tungsten to form base contacts 19b and emitter contacts 19a. The base contacts 19b are thus in direct electrical contact with the base regions 13, and the emitter contacts 19a are in direct electrical contact with the emitter regions 15. In this way, the structure of FIG. 1 is obtained. The base regions 13, base contact regions 14, and emitter regions 15 form selection elements for the memory cells.

Figure 2:
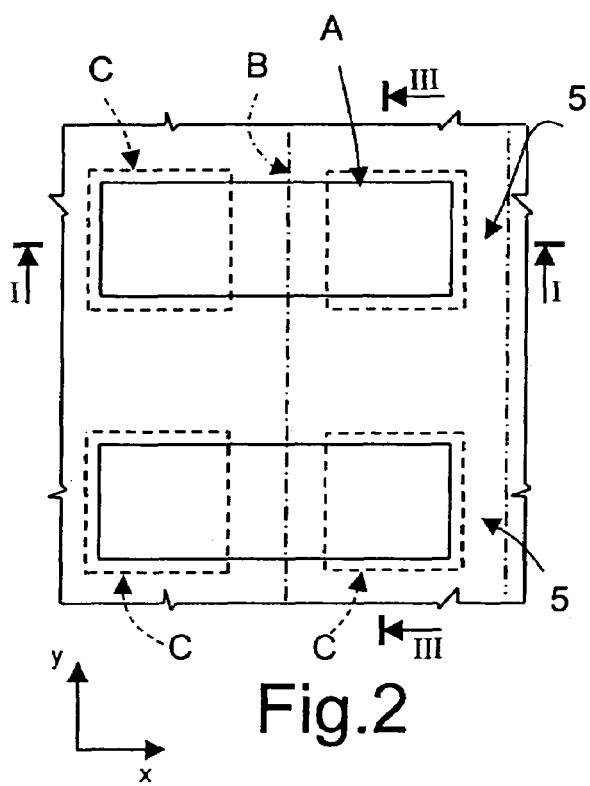
FIG. 2 shows the layout of some masks used for forming the structure of FIG. 1.

FIG. 2 shows the layout of some masks used for forming the structure of FIG. 1 regarding a pair of memory cells 5 that are adjacent in a perpendicular direction to the sectional plane of FIG. 1 (Y direction). In particular, FIG. 2 shows a mask A used for defining the active areas 16, a mask B for implanting the emitter regions 15, and a mask C used for forming the openings where the base contacts 19b and the emitter contacts 19a are to be formed.

Figure 4:
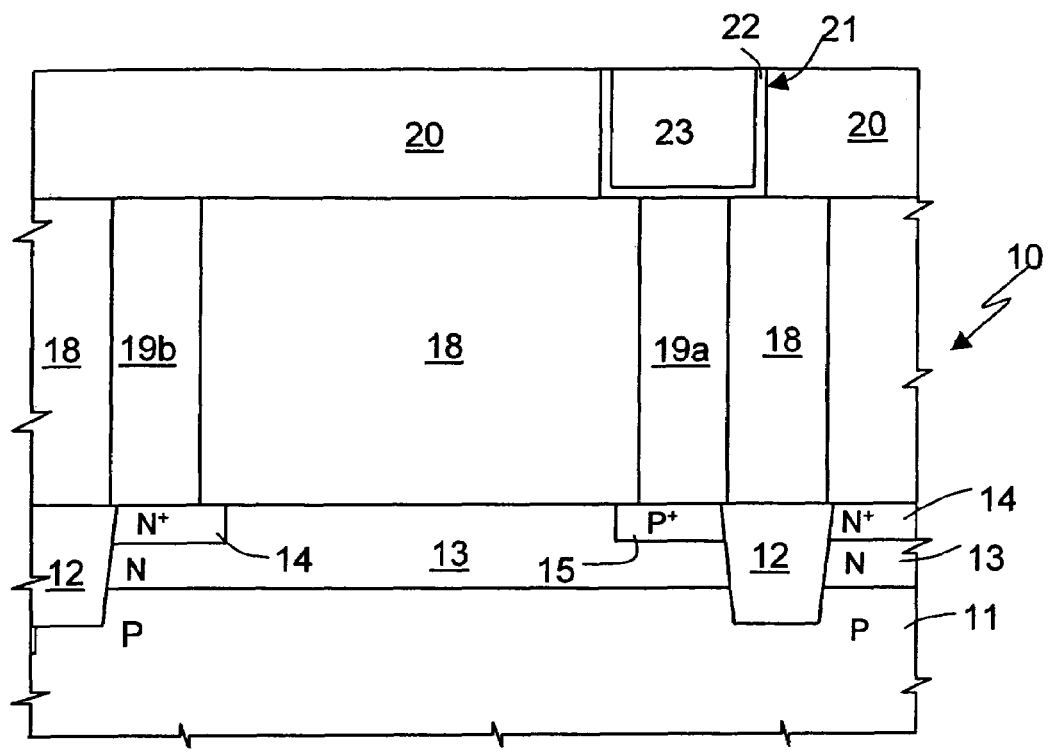
FIG. 4 is a cross section of the wafer of FIG. 1, in a subsequent manufacturing step.

Next (FIG. 4), a second dielectric layer 20, for example, an undoped silicon glass (USG) layer, is deposited, and openings 21 are formed in the second dielectric layer 20 above the emitter contact 19a. The openings 21 have dimensions dictated by the lithographic process and are, for example, circle-shaped. Next, a heating layer 22, for example of TiSiN, TiAlN or TiSiC, is deposited for a thickness of 5-50 nm, preferably 20 nm. The heating layer 22 conformally coats the walls and bottom of the openings 21. The openings 21 are then completely filled with dielectric material 23. Advantageously the dielectric material 23 is the same used for forming the dielectric layer 20. The heating layer 22 and the dielectric material 23 are removed outside the openings 21 by CMP ("Chemical Mechanical Polishing") and the surface of the wafer 10 is planarized. The remaining portions of the heating layer 22 form a cup-shaped region 22 which, from above, has a ring-like shape and is externally surrounded by the second dielectric layer 20 and is internally filled by the dielectric material 23.

Figure 5:
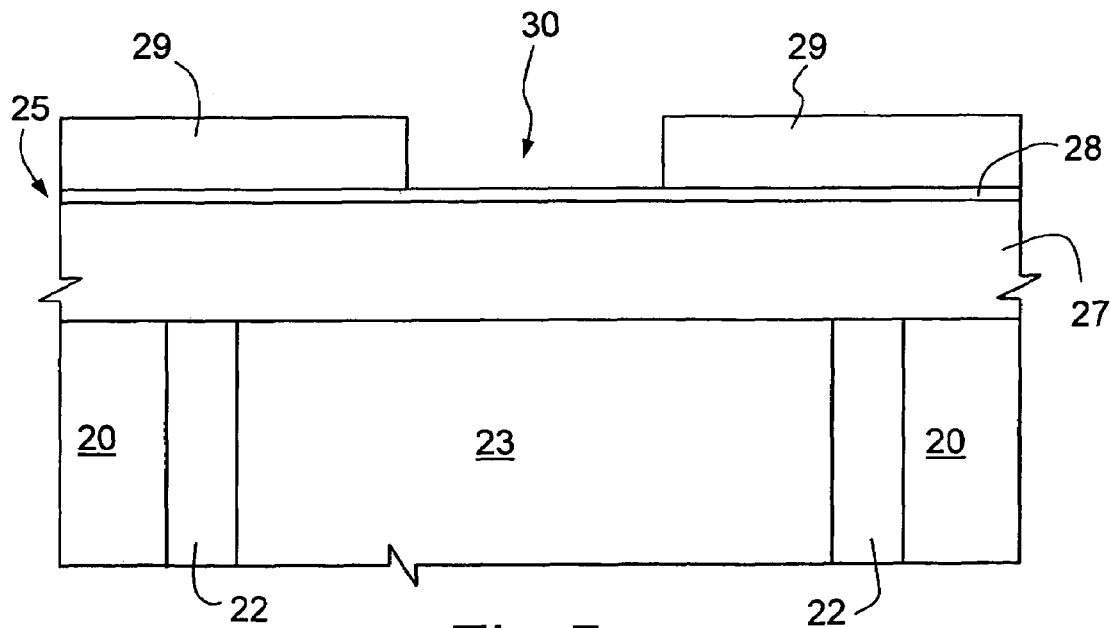
FIG. 5 is an enlarged detail of the wafer of FIG. 4 in a subsequent manufacturing step.

Next, as shown in the enlarged detail of FIG. 5, a microtrench stack 25 is formed so as to cover the whole surface of the wafer 10. The microtrench stack 25 comprises at least a mold layer 27, preferably of silicon nitride having a thickness of 60-90 nm, and an adhesion layer 28, for instance Ti or Si with a thickness of 5 nm. A photoresist mask 29 is then deposited on the microtrench stack 25. As illustrated in FIG. 6, the photoresist mask 29 has apertures 30 which expose portions of the microtrench stack 25 extending above the dielectric material 23 and crossing the cup shaped region 22. The width of the apertures 30 is about 130-150 nm, i.e., greater than minimum dimension obtainable through optical UV lithography.

Subsequently, the microtrench stack 25 is etched through the apertures 30, so as to open microtrenches 31 having inclined walls 32 and tapered profile, as shown in FIG. 7. The exposed portion of the adhesion layer 28 is preliminarily removed in a known manner and then the mold layer 27 is plasma etched through its entire height. In this step, a combined chemical and physical plasma etch is carried out. In particular, an etchant mixture of a boron halide, preferably $BCl_3$, and chlorine $Cl_2$ is supplied to the wafer 10. The etchant mixture may comprise also a small amount of $CHF_3$, to increase etching rate. For example, a suitable etchant mixture comprises 90% to 40% of $BCl_3$ (preferably 58%), 49% to 10% of $Cl_2$ (preferably 38%), and less than 10% of $CHF_3$ (preferably 4%). In any case, $BCl_3$ is the prevalent etchant agent.

Plasma containing $BCl_3$ is highly sputtering, since $BCl_3$ is suitable to be used as a supplier of bombarding boron ions 33, which are schematically indicated with arrows in FIG. 7. Bondings inside the mold layer 27 (Si—N bonding, in this case) are weak enough to break up under ion bombarding with boron ions 33; also possible metallic residues of the adhesion layer 28 are removed by sputtering. Moreover, the sputtering yield of $BCl_3$ depends on the impinging angle of the boron ions 33 and is maximized at around 70°. So, under the prevailing sputtering regime of $BCl_3$, the etched portions of the mold layer 27 slope and tend to converge to that angle which maximizes the sputtering yield. In this condition, the greatest energy gain is achieved. Accordingly, the inclined walls 32 of the mold layer 27 and the wafer surface 10a form an angle α which is close to the angle of maximum sputtering yield. More precisely, the angle α is about 60°-70° and also accounts for chemical etching, as explained hereinafter.

In fact, $BCl_3$ etches the mold layer 27 chemically as well. In particular, the chemical etching rate of $BCl_3$ is rather low, however, is enough to increase overall etching rate. Moreover, $BCl_3$ has a negligible polymerization rate, so that polymer deposition on the walls 32 is substantially prevented. $Cl_2$ and $CHF_3$ further increase chemical etching rate.

The microtrench 31 has a sublithographic bottom width W1 (preferably around 50 nm) and a lithographic top width W2 (about 130-150 nm), which is determined by the thickness of the mold layer 27, the width of the apertures 30 of the mask 29, and the slope of the walls 32. In particular, the slope of the walls 32 of the microtrench 31 depends on both physical (sputtering) and chemical etching, as already explained; however, the profile of the microtrench 31 may be controlled primarily through the physical effect and secondarily through the chemical effect, since sputtering prevails. Preferred slope of the walls 32 is about 65°.

After removing the mask 29 (FIG. 8), a chalcogenic layer 35, for example of $Ge_2Sb_2Te_5$ with a thickness of 60 nm, is deposited conformally. A thin portion 35a of the chalcogenic layer 35 fills the microtrench 31 and forms, at the intersection with the cup-shaped region 22, a phase change region 36, having substantially the bottom width W1 of the microtrench 31 (see also FIG. 9). Then, on top of the chalcogenic layer 35 a barrier layer 37, for example of Ti/TiN, and a metal layer 38, for example of AlCu, are deposited. The structure of FIG. 8 is thus obtained.

Figure 10:
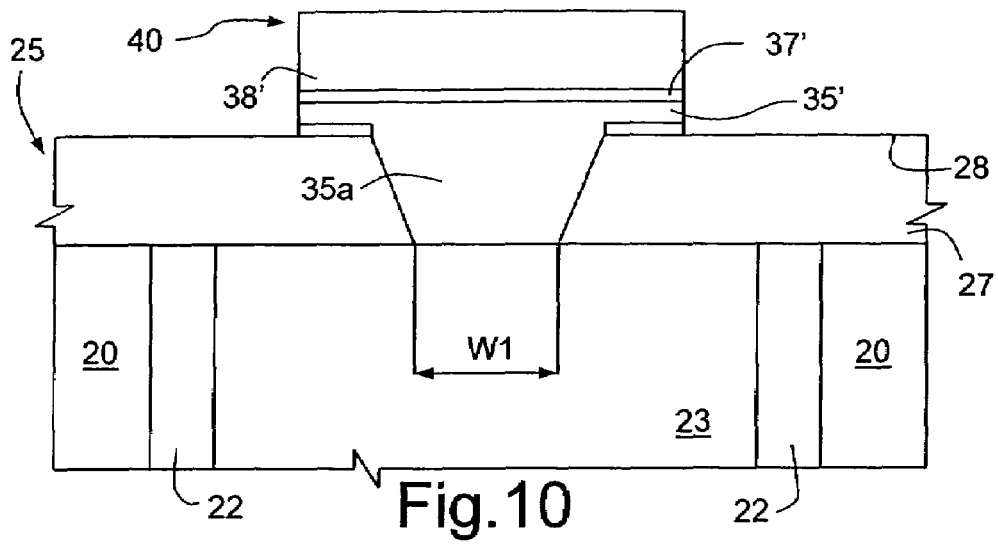
FIGS. 10 and 11 are cross-sections of the detail of FIG. 9, taken along lines X-X and, respectively, XI-XI of FIG. 9, in a subsequent manufacturing step.
Figure 11:
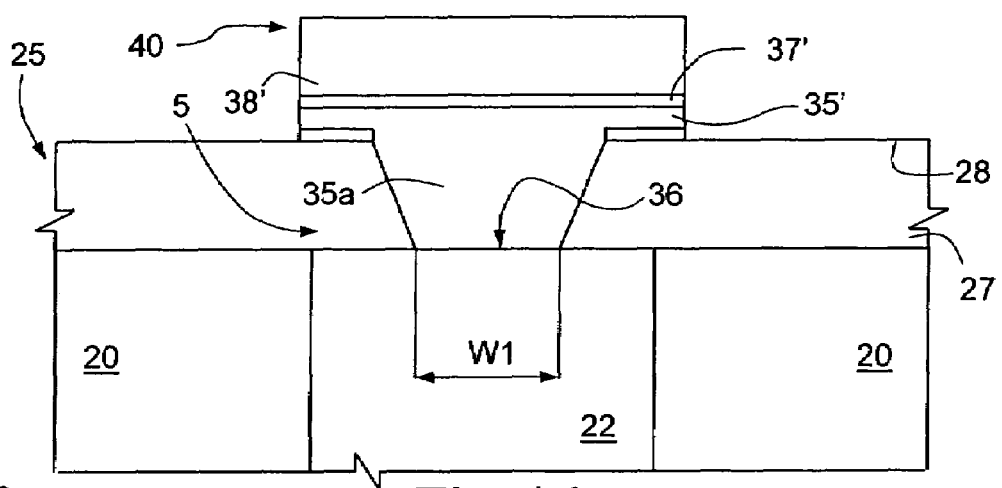
Figure 12:
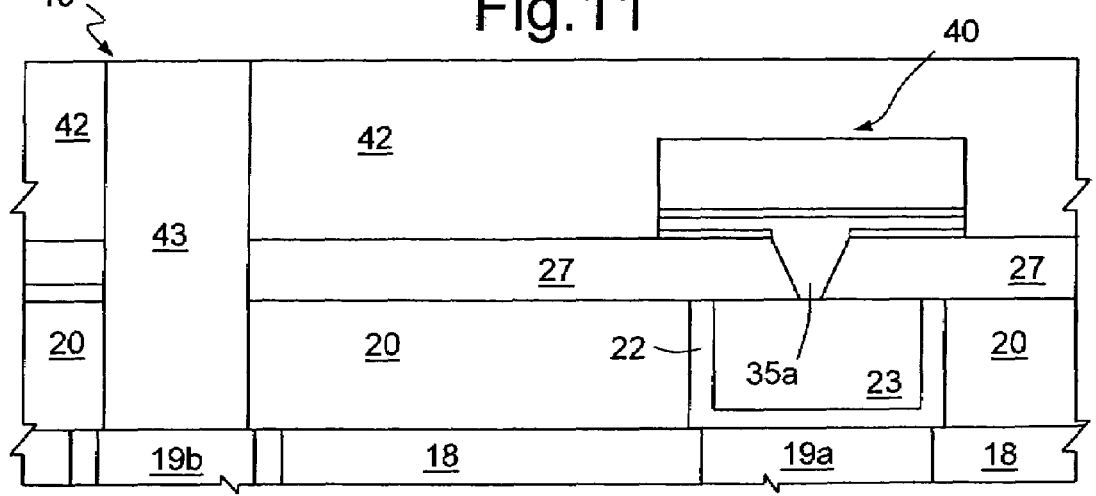
FIG. 12 is a cross-section through the wafer of FIG. 1, at a final manufacturing step.

Next (FIGS. 10 and 11), the stack formed by the metal layer 38, barrier layer 37, chalcogenic layer 35, and adhesion layer 28 is defined using a same mask to form a bit line 40. Finally (FIG. 12), a third dielectric layer 42 is deposited, planarized, for example by CMP, and then opened above the base contacts 19b and above a portion (not shown) of the bit line 40. The openings thus formed are filled with tungsten to form top contacts 43 in order to prolong upwards the base contacts 19b. Then standard steps are performed for forming the connection lines for connection to the base contacts 19b and to the bits lines 40, and the final structure of FIG. 11 is thus obtained.

The process described above has several advantages. First of all, the combination of simultaneous physical and chemical etching actions leads to extremely high precision in controlling the overall etching conditions so that also the accuracy of the microtrench profile is greatly improved. In fact, since chemical etching rate of $BCl_3$ is rather slow and physical etching (sputtering) prevails, sidewall etching is substantially prevented. At the same time, however, the chemical action increases the overall etching rate, whereas a purely physical etch would be too slow, and also improves selectivity of the process. In practice, microtrenches with sublithographic bottom width (e.g., 50 nm) may be obtained through plasma etch, starting from masks having lithographic apertures (greater than 100 nm).

Since the polymerization rate of $BCl_3$ is very low, moreover, polymer deposition on the walls of the microtrench is negligible and any possible minor buildup may be easily removed by water rinse. Hence, no dedicated removing step is required.

Finally, it is clear that numerous modifications and variations may be made to the process described and illustrated herein, all falling within the scope of the invention, as defined in the attached claims. First, the process may be exploited in any field in which extremely precise tapered etching of a dielectric layer is required and is not limited to phase change memories. Second, the etching mixture may have different composition compared to the one described. Moreover, other boron halides may be used instead of boron trichloride. An organic anti-reflecting layer may be provided between the adhesion layer 28 and the mask 29, to reduce light scattering and improve precision in defining the mask 29.

The invention claimed is:

1. A process for forming a tapered trench in a dielectric material, comprising the steps of forming a dielectric layer on a semiconductor wafer, and plasma etching said dielectric layer to form the tapered trench in the dielectric layer, wherein said step of plasma etching comprises chemically etching and physically etching said dielectric layer simultaneously and wherein said step of plasma etching comprises supplying a mixture of etchants comprising a boron halide and chlorine, the boron halide being the etchant that is dominant.

2. A process according to claim 1, wherein said step of plasma etching comprises sputtering said dielectric layer.

3. A process according to claim 1, wherein said boron halide is $BCl_3$.

4. A process according to claim 1, wherein said dielectric material is silicon nitride.

5. A process according to claim 1, wherein said mixture of etchants further comprises $CHF_3$.

6. A process according to claim 5, wherein said mixture of etchants comprises less than 10% of $CHF_3$.

7. A process according to claim 1, wherein said trench has at least one sublithographic dimension.

8. A process according to claim 7, wherein said sublithographic dimension is around 50 nm.

9. A process for forming a tapered trench in a dielectric material, comprising the steps of forming a dielectric layer on a semiconductor wafer, and plasma etching said dielectric layer to form the tapered trench in the dielectric layer, wherein said step of plasma etching comprises chemically etching and physically etching said dielectric layer simultaneously, wherein said step of plasma etching comprises supplying an etchant mixture comprising a boron halide, and wherein said etchant mixture contains 58% of $BCl_3$, 38% of $Cl_2$ and 4% of $CHF_3$.

10. The process according to claim 9, wherein said tapered trench has at least one sublithographic dimension.

11. A process for manufacturing a phase change memory cell, comprising the step of forming a tapered trench in a dielectric layer and filling said tapered trench with a phase change material, wherein said step of forming a tapered trench includes simultaneously plasma etching said dielectric layer chemically and physically, and wherein said step of plasma etching comprises supplying an etchant mixture comprising a boron halide.

12. The process according to claim 11 where the physical plasma etching comprises sputtering said dielectric layer.

13. The process according to claim 11 wherein said boron halide is $BCl_3$.

14. The process according to claim 11, wherein said etchant mixture further comprises $CHF_3$.

15. The process according to claim 14, wherein said etchant mixture comprises less than 10% of $CHF_3$.

16. The process according to claim 11, wherein said etchant mixture further comprises $Cl_2$.

17. The process according to claim 16, wherein the boron halide provides an etching amount that is dominant compared to that of $Cl_2$.

18. A process for manufacturing a phase change memory cell, comprising the step of forming a tapered trench in a dielectric layer and filling said tapered trench with a phase change material, wherein said step of forming a tapered trench includes simultaneously plasma etching said dielectric layer chemically and physically, wherein the step of plasma etching includes providing an etchant mixture comprising a boron halide, and wherein said etchant mixture contains 58% of $BCl_3$, 38% of $Cl_2$ and 4% of $CHF_3$.

19. The process according to claim 18 wherein said tapered trench has at least one sublithographic dimension.

20. A process for forming a tapered trench, comprising:
    forming a dielectric layer; and
    plasma etching the dielectric layer to form the tapered trench in the dielectric layer by using an etchant mixture that includes a boron halide, wherein said etchant mixture contains 58% of $BCl_3$, 38% of $Cl_2$ and 4% of $CHF_3$.

21. The process according to claim 20 wherein the step of plasma etching comprises simultaneously etching the dielectric layer physically and chemically.

22. The process according to claim 21 wherein the physical etching is faster than the chemical etching.

23. The process according to claim 22 wherein the physical etching comprises sputtering the dielectric layer.

* * * * *